United States Patent
Liu et al.

(10) Patent No.: US 11,973,107 B2
(45) Date of Patent: Apr. 30, 2024

(54) MANUFACTURING METHOD OF SEMICONDUCTOR SUPER-JUNCTION DEVICE

(71) Applicant: SUZHOU ORIENTAL SEMICONDUCTOR CO., LTD., Jiangsu (CN)

(72) Inventors: Wei Liu, Jiangsu (CN); Yuanlin Yuan, Jiangsu (CN); Rui Wang, Jiangsu (CN); Lei Liu, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 17/621,486

(22) PCT Filed: Nov. 10, 2020

(86) PCT No.: PCT/CN2020/127699
§ 371 (c)(1),
(2) Date: Dec. 21, 2021

(87) PCT Pub. No.: WO2022/082885
PCT Pub. Date: Apr. 28, 2022

(65) Prior Publication Data
US 2023/0246066 A1    Aug. 3, 2023

(30) Foreign Application Priority Data

Oct. 20, 2020 (CN) .......................... 202011125896.8

(51) Int. Cl.
*H01L 29/06* (2006.01)
*H01L 21/308* (2006.01)
*H01L 29/78* (2006.01)

(52) U.S. Cl.
CPC ...... *H01L 29/0634* (2013.01); *H01L 21/3086* (2013.01); *H01L 29/7813* (2013.01)

(58) Field of Classification Search
CPC ............ H01L 29/0634; H01L 21/3086; H01L 29/7813; H01L 21/3083; H01L 29/66734;
(Continued)

(56) References Cited

U.S. PATENT DOCUMENTS

| 5,096,848 A | 3/1992 | Kawamura |
|---|---|---|
| 2010/0096692 A1 | 4/2010 | Saito et al. |
| 2019/0296147 A1* | 9/2019 | Kawamura ....... H01L 29/66734 |

FOREIGN PATENT DOCUMENTS

| CN | 101414553 | 4/2009 |
|---|---|---|
| CN | 104103519 | 10/2014 |

(Continued)

OTHER PUBLICATIONS

PCT/CN2020/127699 International Search Report dated Jul. 21, 2021 (and translation).
(Continued)

*Primary Examiner* — Mohammad M Hoque
(74) *Attorney, Agent, or Firm* — Michael Best & Friedrich LLP

(57) ABSTRACT

A manufacturing method of a semiconductor super-junction device includes the following steps: An n-type substrate is etched in a self-aligning manner using a first insulating layer and a second insulating layer as a mask to form a second groove in the n-type substrate. A gate structure is formed in the second groove.

8 Claims, 5 Drawing Sheets

(58) Field of Classification Search
CPC ............... H01L 21/308; H01L 29/4236; H01L 29/7802
USPC ........................................................ 438/270
See application file for complete search history.

(56) References Cited

FOREIGN PATENT DOCUMENTS

| | | |
|---|---|---|
| CN | 107359201 | 11/2017 |
| CN | 108258027 | 7/2018 |
| CN | 108767000 | 11/2018 |
| CN | 109830532 | 5/2019 |
| CN | 111326585 | 6/2020 |
| WO | WO0247171 | 6/2002 |

OTHER PUBLICATIONS

Chinese Patent Application No. 202011125896.8 First Office Action issued by the State Intellectual Property Office of People's Republic of China and Search Report dated Jul. 19, 2021 (and translation).

\* cited by examiner

MANUFACTURING METHOD OF SEMICONDUCTOR SUPER-JUNCTION DEVICE

CROSS-REFERENCE TO RELATED APPLICATION(S)

This is a national stage application filed under 37 U.S.C. 371 based on International Patent Application No. PCT/CN2020/127699, filed Nov. 10, 2020, which claims priority to Chinese Patent Application No. 202011125896.8 filed Oct. 20, 2020, the disclosures of which are incorporated herein by reference in their entireties.

TECHNICAL FIELD

The present application belongs to the field of semiconductor super-junction device technology, and relates to a manufacturing method of a semiconductor super-junction device.

BACKGROUND

Based on charge balance technology, semiconductor super-junction devices can reduce on-state resistance and parasitic capacitance. With this configuration, the semiconductor super-junction devices have extremely fast switching characteristics. In this manner, switching loss can be reduced, and higher power conversion efficiency can be achieved. The main manufacturing process of the semiconductor super-junction devices in a prior art includes the steps described below. First, as shown in FIG. 1, a first insulating layer 11 is formed on an n-type substrate 10. Then photolithography and etching are performed. An opening is formed in the first insulating layer 11, and a groove 12 is formed in the n-type substrate 10. Next, as shown in FIG. 2, the first insulating layer is removed. A p-type column 13 is formed in the formed groove through an epitaxial process. Then, as shown in FIG. 3, one photolithography process and an etching process are performed to form a gate dielectric layer 14 and a gate 15. Then a p-type body region 16 located in the n-type substrate 10, and an n-type source region 17 located in the p-type body region 16 are formed in the n-type substrate 10. Regardless of whether it is a planar-type semiconductor super-junction device or a groove-type semiconductor super-junction device, one photolithography process is required when the p-type columns are formed. Then one photolithography process is required again when the gate is formed. Due to the high cost of the photolithography process and the risk of misalignment, the manufacturing costs and the manufacturing risks of the semiconductor super-junction devices are high.

SUMMARY

The present application provides a manufacturing method of a semiconductor super-junction device to reduce the manufacturing costs of the semiconductor super-junction device and reduce the manufacturing risks of the semiconductor super-junction device.

The present application provides a manufacturing method of a semiconductor super-junction device. The method includes the steps described below.

A first insulating layer is formed on an n-type substrate. The first insulating layer is etched to form an opening.

An insulating sidewall is formed in the opening.

The n-type substrate is etched using the first insulating layer and the insulating sidewall as a mask to form a first groove in the n-type substrate.

A p-type column is formed in the first groove. The p-type column and the n-type substrate form a pn junction structure.

A second insulating layer is formed on the surface of the p-type column.

Moreover, the insulating sidewall is etched off, and the n-type substrate is etched using the first insulating layer and the second insulating layer as the mask to form a second groove in the n-type substrate.

Optionally, the manufacturing method of a semiconductor super-junction device according to the present application further includes the steps described below.

The first insulating layer and the second insulating layer are etched off. A gate dielectric layer and a gate are formed in the second groove. The gate is isolated from the p-type column by the gate dielectric layer.

A p-type body region is formed in the n-type substrate.

An n-type source region is formed in the p-type body region.

Optionally, the first insulating layer includes a silicon oxide layer.

Optionally, the second insulating layer is the silicon oxide layer.

Optionally, the insulating sidewall is a silicon nitride layer.

Optionally, an etching method combining anisotropic etching and isotropic etching is performed when the second groove is formed by etching.

Optionally, the depth of the second groove is less than the depth of the first groove.

In the manufacturing method of a semiconductor super-junction device according to the present application, the first groove is formed by one photolithography process, and the n-type substrate is etched in a self-aligning manner using the first insulating layer and the second insulating layer as the mask to form the second groove in the n-type substrate. In the manufacturing method of a semiconductor super-junction device according to the present application, merely one photolithography process is required to form the gate and the p-type column. In this manner, the manufacturing costs of the semiconductor super-junction device can be reduced greatly, and the manufacturing risks of the semiconductor super-junction device can be reduced.

BRIEF DESCRIPTION OF DRAWINGS

To illustrate the solutions in the exemplary embodiment of the present application more clearly, the drawings used in the embodiment are described below.

DETAILED DESCRIPTION

Figure 1:
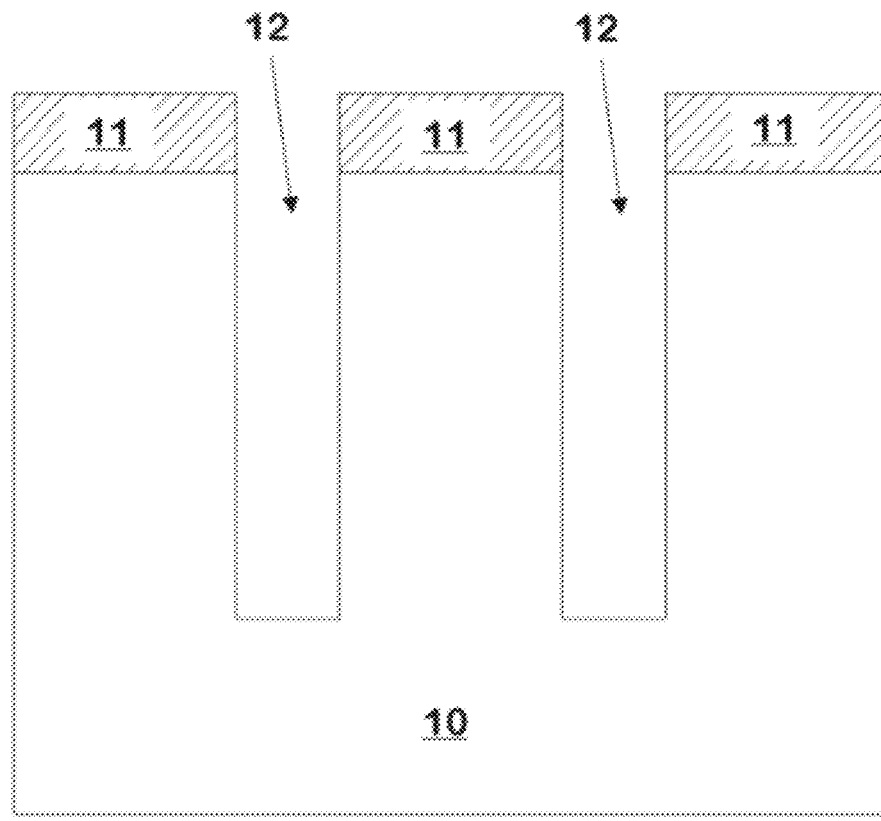
FIGS. 1 to 3 are sectional views illustrating the main structures in the manufacturing process of a semiconductor super-junction device of the related art.
Figure 2:
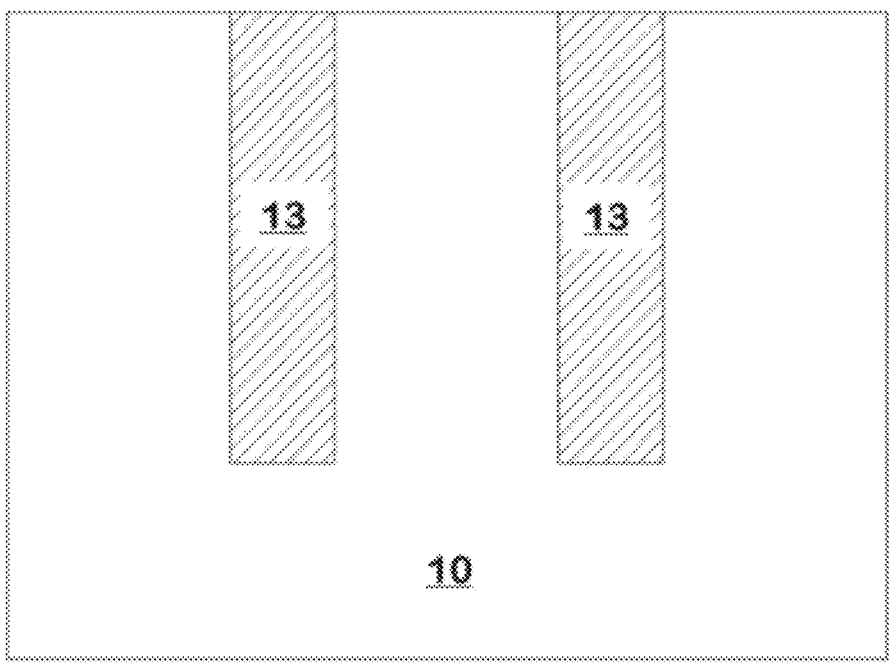
Figure 3:
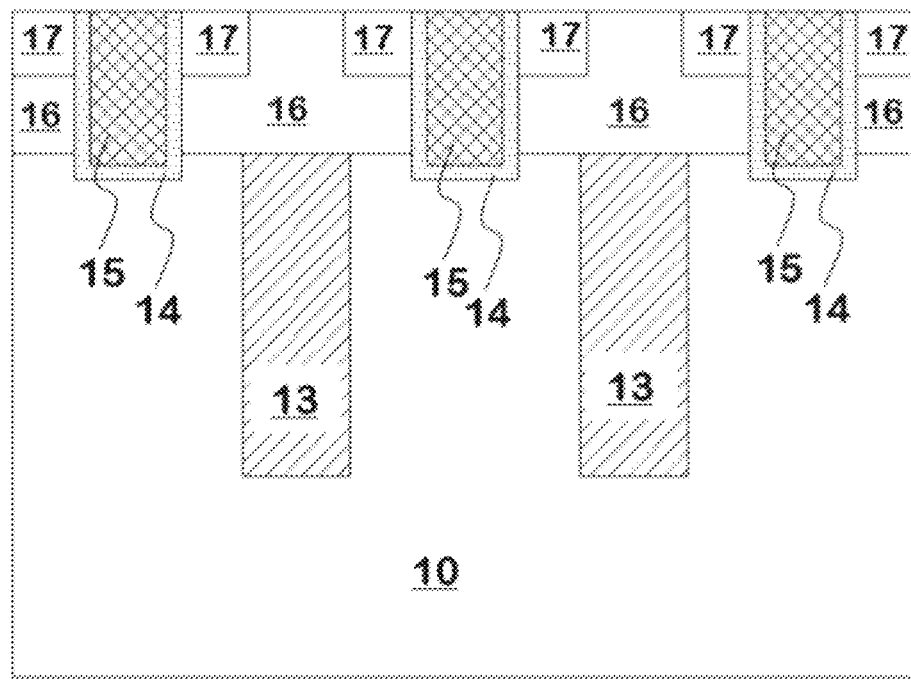

The solutions of the present application are described in detail hereinafter through specific implementations in conjunction with the drawings in the embodiment of the present application. Apparently, the described embodiment is one embodiment of the present application. At the same time, to illustrate the specific implementations of the present application clearly, the views listed in the drawings enlarge the thicknesses of the layers and the thicknesses of regions described in the present application, and the sizes of the graphics listed do not represent actual dimensions.

FIGS. 4 to 9 are sectional views illustrating the main structures in the manufacturing method of a semiconductor super-junction device of one embodiment of the present application.

Figure 4:
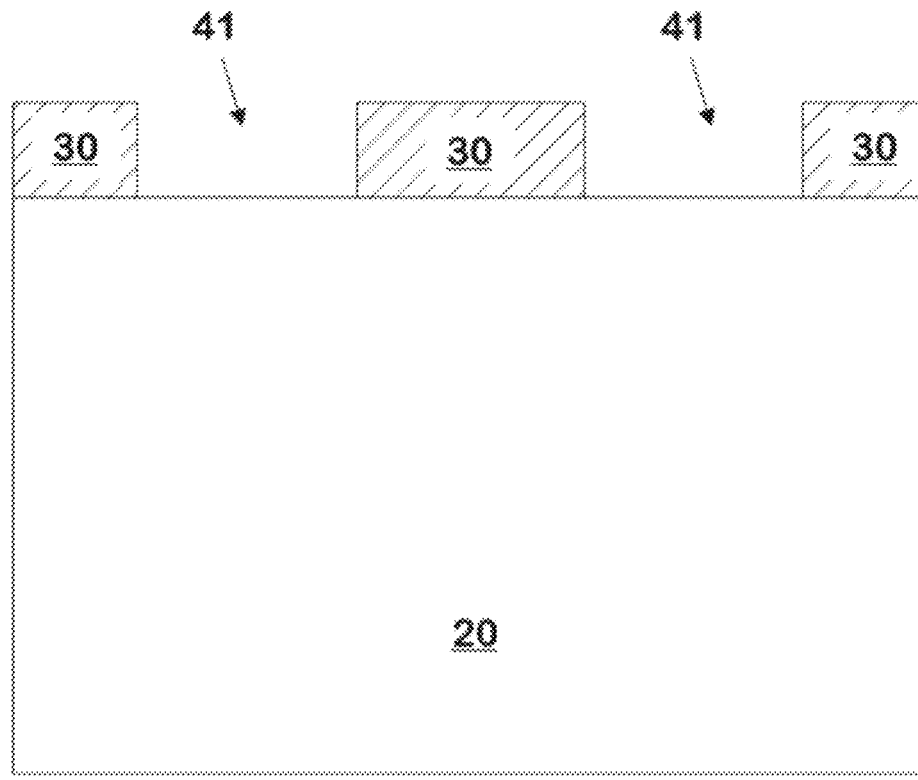
FIGS. 4 to 9 are sectional views illustrating the main structures in the manufacturing method of a semiconductor super-junction device of one embodiment of the present application.

First, as shown in FIG. 4, the first insulating layer 30 is formed on the provided n-type substrate 20. The n-type substrate 20 is generally a silicon substrate. The first insulating layer 30 includes the silicon oxide layer. For example, the first insulating layer 30 may be the silicon oxide layer or the lamination of silicon oxide layer—silicon nitride layer—silicon oxide layer. The position of the opening is defined by the photolithography process. Then the first insulating layer 30 is etched to form the opening 41 in the first insulating layer 30. The number of the opening 41 is determined by the specification of the designed semiconductor super-junction device. For example, only two openings 41 are shown in the embodiment of the present disclosure.

Figure 5:
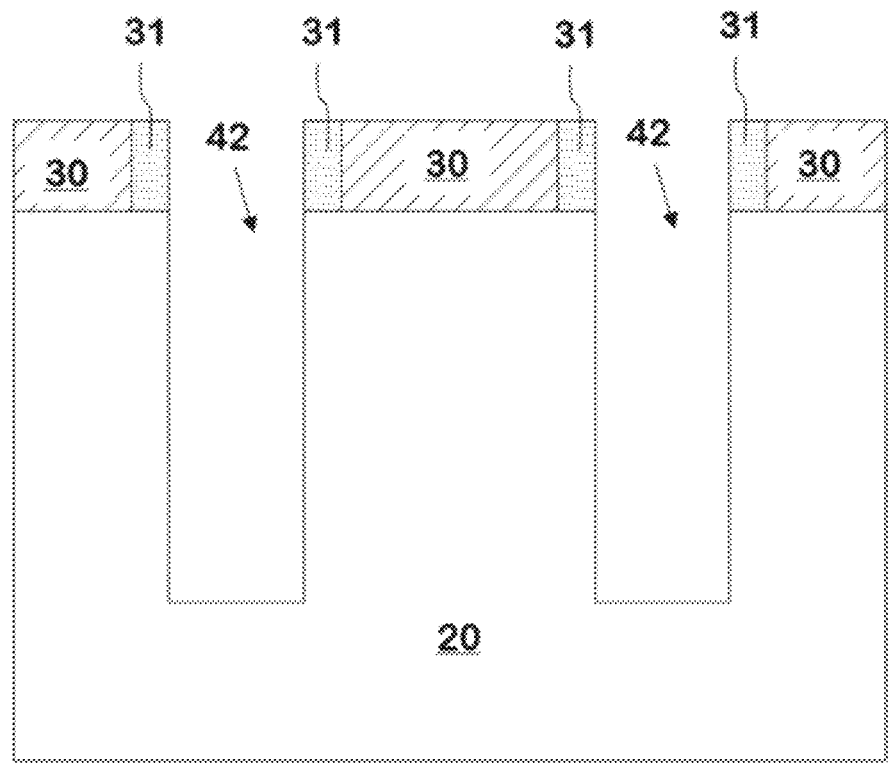

Next, as shown in FIG. 5, the insulating sidewall 31 is formed in the opening. The insulating sidewall 31 may be the silicon nitride layer. A specific process includes the steps described below. First, a silicon nitride layer is deposited. Then, the deposited silicon nitride layer is etched back. Therefore, the insulating sidewall 31 is formed in the self-aligning manner at the sidewall position of the opening. After the insulating sidewall 31 is formed, the n-type substrate 20 is etched using the first insulating layer 30 and the insulating sidewall 31 as the mask to form the first groove 42 in the n-type substrate 20.

Figure 6:
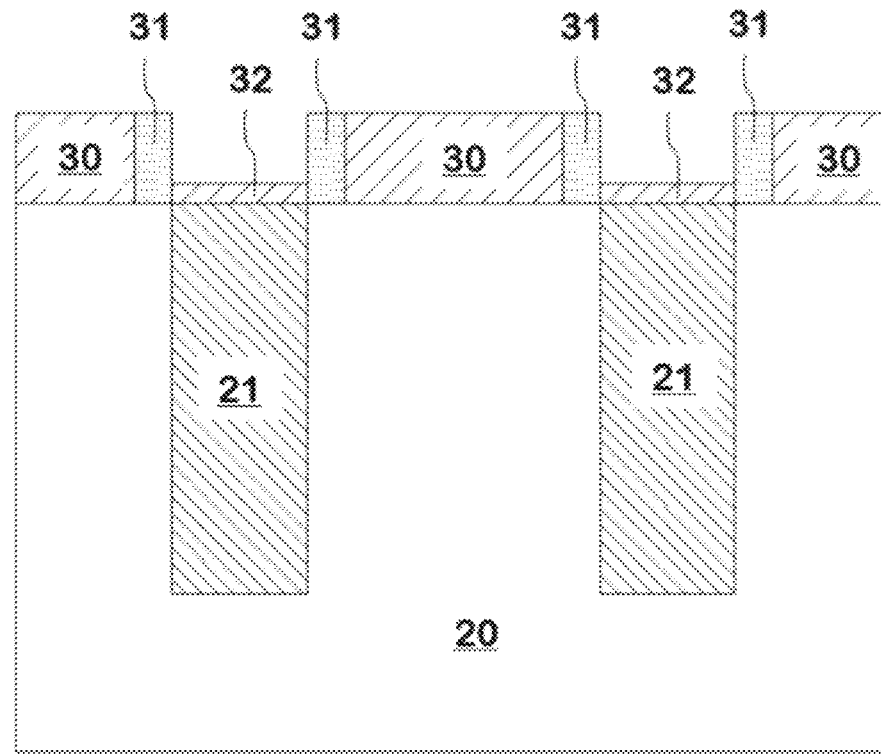

Next, as shown in FIG. 6, the p-type column 21 is formed in the first groove by an epitaxial process. Generally, a layer of p-type silicon is epitaxed first. Then the p-type silicon is etched. The remaining p-type silicon layer after etching forms the p-type column 21. The p-type column 21 and the n-type substrate form the pn junction structure. Thereafter, the second insulating layer 32 is formed on the surface of the p-type column 21. The second insulating layer 32 may be the silicon oxide layer by a process of thermal oxidation.

Figure 7:
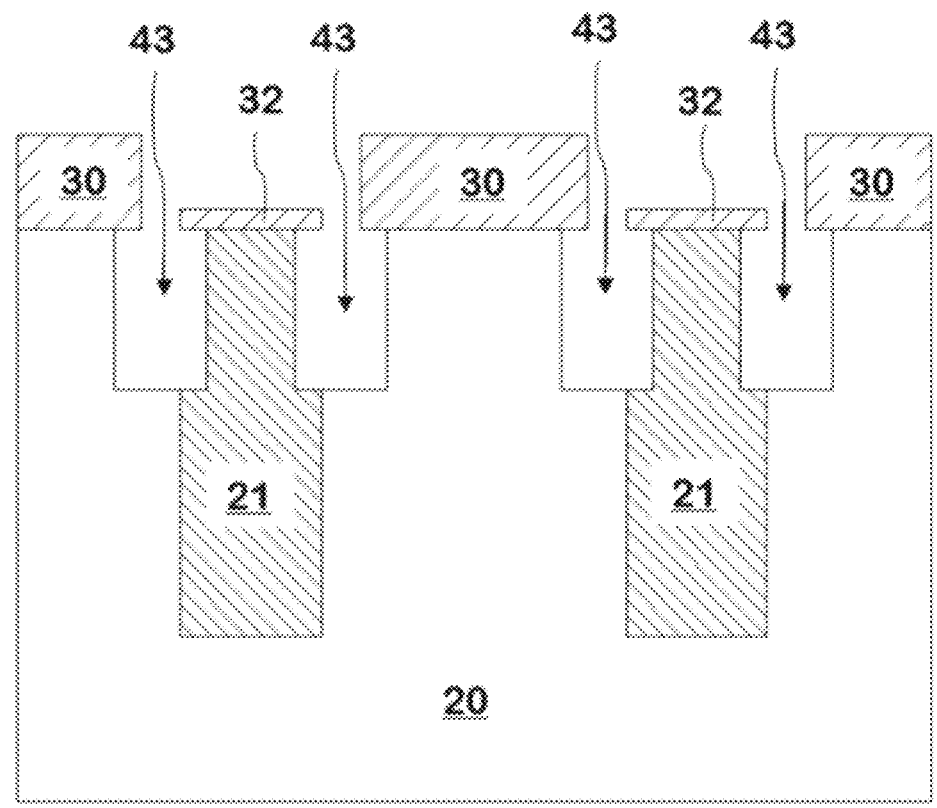

Next, as shown in FIG. 7, the insulating sidewall is etched off. The n-type substrate 20 is etched using the first insulating layer 20 and the second insulating layer 32 as the mask to form the second groove 43 in the n-type substrate 20. The depth of the second groove 43 is less than the depth of the first groove.

The etching method combining anisotropic etching and isotropic etching is performed when the second groove 43 is formed by etching. In this manner, the width of the second groove 43 may be increased. As a result, the width of the second groove 43 is greater than the width of the insulating sidewall. At this time, the upper part of the p-type column 21 may be partially etched off. Therefore, the width of the upper part of the p-type column 21 is less than the width of the lower part of the p-type column 21. The width of the gate formed later may be increased with the arrangement in which the width of the second groove 43 is increased. Therefore, the gate is more easily extracted, and the reliability of the semiconductor super-junction device is improved.

Figure 8:
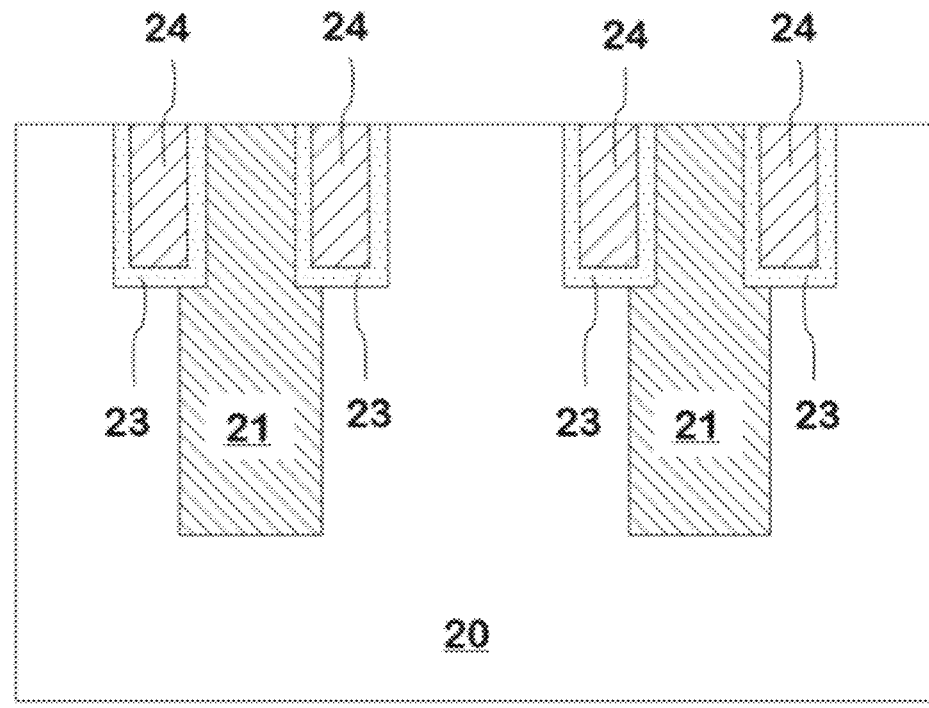

Next, as shown in FIG. 8, the first insulating layer and the second insulating layer are etched off. The gate dielectric layer 23 and gate 24 is formed in the second groove. The gate 24 is isolated from the p-type column 21 by the gate dielectric layer 23. Optionally, the gate dielectric layer 23 and the gate 24 are formed in the second groove first. Then the first insulating layer and the second insulating layer are etched off.

Figure 9:
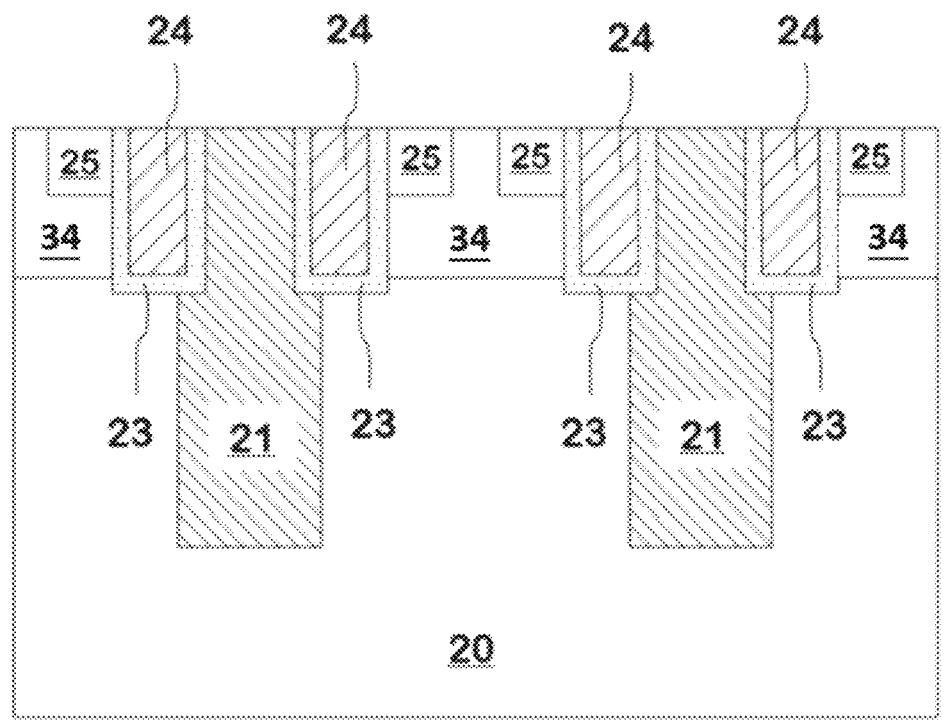

Next, as shown in FIG. 9, the p-type body region 34 is formed in the n-type substrate 20. The n-type source region 25 is formed in the p-type body region 34.

Finally, the semiconductor super-junction device can be obtained with the arrangement in which an isolation dielectric layer, a metal layer, and the like are formed according to a conventional process.

In the manufacturing method of a semiconductor super-junction device according to the present application, the first groove is formed by one photolithography process; the p-type column is formed in the first groove, and the second insulating layer is formed on the surface of the p-type column; then the n-type substrate is etched in the self-aligning manner using the first insulating layer and the second insulating layer as the mask to form the second groove in the n-type substrate; and the gate dielectric layer and the gate are formed in the second groove. Therefore, in the manufacturing method of a semiconductor super-junction device according to the present application, merely one photolithography process is required to form the gate and the p-type column. In this manner, the manufacturing costs of the semiconductor super-junction device can be reduced greatly, and the manufacturing risks of the semiconductor super-junction device can be reduced.

The preceding implementations and the preceding embodiment are concrete supports for the technical idea of the present application, and thus do not limit the protection scope of the present application. The protection scope of the present application is subject to the claims.

What is claimed is:

1. A manufacturing method of a semiconductor super-junction device, comprising:
    forming a first insulating layer on an n-type substrate and etching the first insulating layer to form an opening;
    forming an insulating sidewall in the opening;
    etching the n-type substrate using the first insulating layer and the insulating sidewall as a mask to form a first groove in the n-type substrate;
    forming a p-type column in the first groove such that the p-type column and the n-type substrate form a pn junction structure;
    forming a second insulating layer on a surface of the p-type column; and
    etching off the insulating sidewall; and etching the n-type substrate using the first insulating layer and the second insulating layer as a mask to form a second groove in the n-type substrate.

2. The manufacturing method of the semiconductor super-junction device of claim 1, further comprising:
    etching off the first insulating layer and the second insulating layer, and then forming a gate dielectric layer and a gate in the second groove such that the gate is isolated from the p-type column by the gate dielectric layer;
    forming a p-type body region in the n-type substrate; and
    forming an n-type source region in the p-type body region.

3. The manufacturing method of the semiconductor superjunction device of claim 1, further comprising:
- forming a gate dielectric layer and a gate in the second groove such that the gate is isolated from the p-type column by the gate dielectric layer, and then etching off the first insulating layer and the second insulating layer;
- forming a p-type body region in the n-type substrate; and
- forming an n-type source region in the p-type body region.

4. The manufacturing method of the semiconductor superjunction device of claim 1, wherein the first insulating layer comprises a silicon oxide layer.

5. The manufacturing method of the semiconductor superjunction device of claim 1, wherein the second insulating layer is a silicon oxide layer.

6. The manufacturing method of the semiconductor superjunction device of claim 1, wherein the insulating sidewall is a silicon nitride layer.

7. The manufacturing method of the semiconductor superjunction device of claim 1, wherein an etching method combining anisotropic etching and isotropic etching is performed when the second groove is formed by etching.

8. The manufacturing method of the semiconductor super junction device of claim 1, wherein a depth of the second groove is less than a depth of the first groove.

* * * * *